United States Patent
Florides et al.

(10) Patent No.: US 11,456,698 B2
(45) Date of Patent: Sep. 27, 2022

(54) EARLY DETECTION OF POTENTIAL INDUCED DEGRADATION IN PHOTOVOLTAIC SYSTEMS

(71) Applicant: University of Cyprus, Nicosia Cyprus (CY)

(72) Inventors: Michalis Florides, Nicosia (CY); George Makrides, Nicosia (CY); George E. Georghiou, Limassol (CY)

(73) Assignee: University of Cyprus, Aglantzia (CY)

( * ) Notice: Subject to any disclaimer, the term of this patent is extended or adjusted under 35 U.S.C. 154(b) by 305 days.

(21) Appl. No.: 16/804,913

(22) Filed: Feb. 28, 2020

(65) Prior Publication Data

US 2021/0273607 A1    Sep. 2, 2021

(51) Int. Cl.
| | | |
|---|---|---|
| *H02S 50/00* | (2014.01) | |
| *H02J 3/28* | (2006.01) | |
| *H02S 40/30* | (2014.01) | |
| *G01R 31/40* | (2020.01) | |
| *H02J 3/38* | (2006.01) | |

(52) U.S. Cl.
CPC .............. *H02S 50/00* (2013.01); *G01R 31/40* (2013.01); *H02J 3/381* (2013.01); *H02S 40/30* (2014.12); *H02J 2300/24* (2020.01)

(58) Field of Classification Search
None
See application file for complete search history.

(56) References Cited

U.S. PATENT DOCUMENTS

| | | |
|---|---|---|
| 2010/0079147 A1 | 4/2010 | Zapalac, Jr. et al. |
| 2010/0225514 A1 | 9/2010 | Inoue |
| 2011/0053351 A1 | 3/2011 | Tsai et al. |
| 2011/0133750 A1 | 3/2011 | Zapalac et al. |
| 2011/0241720 A1 | 10/2011 | Beck |
| 2012/0049855 A1 | 3/2012 | Crites |
| 2012/0049875 A1 | 3/2012 | Belser et al. |
| 2013/0015875 A1 | 1/2013 | Kumar |
| 2013/0181736 A1 | 7/2013 | Gostein et al. |
| 2014/0132302 A1 | 5/2014 | Nagel |
| 2014/0188410 A1 | 7/2014 | Kerrigan et al. |
| 2014/0360553 A1 | 12/2014 | Yoshidomi et al. |
| 2015/0094967 A1* | 4/2015 | Kouno .................. H02S 50/00 702/58 |

(Continued)

FOREIGN PATENT DOCUMENTS

| | | |
|---|---|---|
| DE | 102011051091 | 6/2012 |
| DE | 10 2011 051091 | 12/2012 |

(Continued)

OTHER PUBLICATIONS

European Search Report—Appln. No. 20189700.6-1211 dated Jan. 26, 2021—6 pages.

(Continued)

*Primary Examiner* — Jermele M Hollington
(74) *Attorney, Agent, or Firm* — K&L Gates LLP

(57) ABSTRACT

A photovoltaic ("PV") sensor for the early detection of potential induced degradation ("PID") comprising a housing; a power source located within the housing; an electrical connection presented by the housing for electrically communicating the power source with a PV module; and wherein current supplied by the power source to the PV module is less than 10 mA.

21 Claims, 11 Drawing Sheets

(56) References Cited

U.S. PATENT DOCUMENTS

| | | | |
|---|---|---|---|
| 2015/0188487 A1 | 7/2015 | Yoshidomi et al. | |
| 2016/0162616 A1 | 6/2016 | Hasan et al. | |
| 2016/0204773 A1 | 7/2016 | Jariwala et al. | |
| 2016/0276976 A1 | 9/2016 | Davis et al. | |
| 2016/0315584 A1 | 10/2016 | Kouno et al. | |
| 2016/0322934 A1 | 11/2016 | Nos Aguila et al. | |
| 2017/0102675 A1* | 4/2017 | Drees | H02S 50/00 |
| 2017/0104451 A1 | 4/2017 | Gostein et al. | |
| 2017/0155274 A1* | 6/2017 | Cher | H02J 7/0068 |
| 2017/0163213 A1 | 6/2017 | Colli et al. | |
| 2017/0170781 A1 | 6/2017 | Kouno et al. | |
| 2017/0230001 A1 | 8/2017 | Gostein et al. | |
| 2017/0310276 A1 | 10/2017 | Takeuchi et al. | |
| 2018/0131322 A1 | 5/2018 | Huang et al. | |
| 2018/0191292 A1* | 7/2018 | Ehlmann | H02S 40/32 |
| 2019/0158020 A1 | 5/2019 | Nos Aguila et al. | |
| 2019/0371835 A1 | 12/2019 | Huang et al. | |

FOREIGN PATENT DOCUMENTS

| | | | |
|---|---|---|---|
| DE | 10 2011 051112 | 12/2012 | |
| DE | 102011051091 | 12/2012 | |
| DE | 102011051112 | 12/2012 | |
| WO | 2012168250 | 12/2012 | |
| WO | WO-2019186347 A1 * | 10/2019 | H02S 40/10 |

OTHER PUBLICATIONS

IEC Technical Specification Photovoltaic (PV) modules—Test methods for the detection of potential-induced degradation—Part 1-1: Crystalline silicon—Delamination; Edition 1.0 Jan. 2020 ISBN 978-2-8322-7693-8—XP82020115A-1—20 pages.

EP Search Report 20189700.6-1211 dated Jan. 26, 2021—6 pages.

"Photovoltaic (PV) modules—Test methods for the detection of potential-induced degradation—Part 1-1: Crytstalline silicon—Delmanination" IEC TS 62804-1-1:2020, IEC 3, Rue de Varembe, P.O. Box 131, CH-1211 Geneva 20, Switzerland.

XP082020115, Retrieved from the Internet: URL:ftp://standard.iec.ch/iects62804-1-1{ed1.0} en.pdf retrieved on Jan. 10, 2020 pp. 8-14.

EP Communication Patent Application No. 20189700.6-1211 / 3872985 dated Sep. 6, 2021, 2 pages.

EP Search Report 20189700.6-1211 / 3872985, 2 pages.

IEC TS 62804-01-1 Technical Specification Edition 1.0 Jan. 2020, Photovoltaic (PV) modules—Test methods for the detection of potential-induced degradation—Part 1-1: Crystalline silicon—Delamination—20 pages.

EP Communication Patent Application No. 20189700.6-1211 / dated Jan. 26, 2021, 3 pages.

Hacke et al., "In-Situ Measurement of Crystalline Silicon Modules Undergoing Potential-Induced Degradation in Damp Heat Stress Testing for Estimation of Low-Light Power Performance," 23rd Workshop on Crystalline Silicon Solar Cells& Modules: Materials and Processes, Breckenridge, Colorado Jul. 28-31, 2013—Technical Report NREL/TP-5200-60044; Aug. 2013—10 pages.

Stoicescu L., "Daysy: Luminescence Imaging of PV Modules in Daylight," Institut fur Photovoltaik, Universitat Stuttgart, Pfaffenwaldring 47, 70569 Stuttgart—2 pages.

Kaden et al., "Power loss prognosis from the thermographic images of PID affected silicon solar modules," Solar Energy Materials & Solar Cells 142 (2015) 24-28.

Oprea et al., "Detection of Potential Induced Degradation in c—Si PV Panels Using Electrical impedance Spectroscopy," 6 pages.

Koch et al., Outdoor Electroluminescence Imaging of Crystalline Photovoltaic Modules: Comparative Study Between Manual Ground-Level Inspections and Drone-Based Aerial Surveys, Conference Paper—Jun. 2016—6 pages.

Spataru et al., "Temperature-dependency analysis and correction methods of in situ power-loss estimation for crystalline silicon modules undergoing potential-induced degradation stress testing," Progress in Photovoltaics: Research and Applications, Prog. Photovolt: Res. Appl. 2015; 23:1536-1549 Published online Jan. 21, 2015 in Wiley Online Library(wileyonlinelibrary.com): DOI: 10:1002/pip 2587—14 pages.

Bhoopathy et al., "Outdoor photoluminescence imaging of photovoltaic modules with sunlight excitation," Wiley Photovoltaics, Received: Jul. 24, 2017 Accepted: 30 Aug. 30, 2017, University of New South Wales, Sydney, Australia—6 pages.

Luo et al., "In-Situ Characterization of Potential-Induced Degradation in Crystalline Silicon Photovoltaic Modules Through Dark I-V Measurements," The Journal of Photovoltaics, vol. 7, No. 1, Jan. 2017,pp. 104-109.

Benatto et al., "Photoluminescence Imaging Induced by Laser Line Scan: Study for Outdoor Field Inspections," 978-1-5386-852907/18 2018 IEEE, pp. 0395-0399.

Kawamura et al., "Quantitative analysis of relationship between leakage current and power loss of multi-crystalline silicon photovolaic module during potential-induced degradation test," Japanese Journal of Applied Physics, 56 122301, 2017—8 pages.

Katayama et al., "Degradation and fault diagnosis of photovoltaic cells using impedance spectroscopy," Solar Energy Materials and Solar Cells 194 (2019), pp. 130-136.

Kaden et al., "Power loss prognosis from thermographic images of PID affected silicon solar modules," Solar Energy Materials & Solar Cells 142 (2015), pp. 24-28.

Yeow et al., "Evaluation of impedance spectroscopy as a tool to characterize degradation mechanisms in silicon photovoltaics," Solar Energy 184 (2019), pp. 52-58.

Florides et al., "Early Detection of Potential Induced Degradation by Measurement of the Forward DC Resistance in Crystalline PV Cells," IEEE Journal Of Photovoltaics, 2156-3381 © 2019 IEEE. See http://www.ieee.org/publications_standards/publications/rights/index.html for more information.

* cited by examiner

EARLY DETECTION OF POTENTIAL INDUCED DEGRADATION IN PHOTOVOLTAIC SYSTEMS

BACKGROUND

The present disclosure relates generally to photovoltaics ("PV") and in particular to the early detection of potential induced degradation ("PID") in same.

PID degradation has gained increased attention in the last few years due to the increased operating voltage PV systems. Different materials that purportedly prevent PID have been proposed, however, they are still under development and their long term stability has yet to be confirmed. Additionally, their optical properties and increased manufacturing cost may prove impractical for widespread industry use. Certain PID-resistant PV modules may only be effective under specific conditions. The current trend to increase the PV system's voltage to 1500 VDC and possibly to 2000 VDC will make PID degradation even worse.

PID has become a major degradation mechanism for silicon wafer-based PV in particular due to the increased system voltage. The high potential developing between the PV modules and ground, and the use of transformer-less inverters (due to their lower cost and higher efficiency), which do not allow for grounding of the negative terminal of a PV module string, heightens PID. Here, high voltage is developed between the electrical terminals of each PV module and its ground, with half of the modules of a string under positive bias and the other half under negative bias. The modules under negative bias, especially the ones at the end of the string, are particularly susceptible to PID. The increasing system voltages render the development of a reliable and affordable method for PID detection a very timely issue due to lost revenue and reduced lifetime of the PV modules. Based on the current global installed capacity, a 1% degradation results in over 500 MEuros (~$550 MM) of lost revenue annually.

One known method for detecting PID involves electroluminescence ("EL") imaging, but is time consuming, costly and it disrupts production because the PV modules have to be dismantled for indoor testing. Outdoor PID detection methods include the use of a drone fitted with a thermal camera to identify PID affected modules, outdoor EL, and photoluminescence imaging. Such methods require expensive equipment, frequent scans, high preparation cost, while suffering inaccuracy. In addition, the methods by and large are difficult to automate.

Other detection methods, such as conventional power loss detection algorithms based on the monitoring of electrical quantities (e.g., inverter input DC voltage and current combined with solar irradiation), are not suitable for PID detection because their power estimation uncertainty can be greater than 5% by conventional methods. PID under outdoor conditions typically progresses slowly, leading to a long term (e.g., a year or more) power loss of up to 5% before detection. Artificial neural network ("ANN") power loss estimation algorithms can reduce the estimation error, however, such networks require long term training that defeats the early PID detection concept.

Another PID detection method uses dark current-voltage ("IV") measurements. It is accepted that sodium ions (Na+) drift under the influence of the electric field that results from the negative bias voltage, which subsequently causes electrical shunting of the PV cell p-n junction affecting dark IV curves. The method has been verified under indoor conditions to provide a power loss estimation for PID progression. The method is, however, not low cost at least in part because it requires relatively high current (0 to 8 Amps) for the measurement.

Impedance spectroscopy is another method for PID detection. The method uses low power signals, however, its cost is relatively high due to high frequency alternating current ("AC") signals used.

For each of the above reasons, an improved PID detection system and method for PV is needed.

SUMMARY

The present disclosure includes a reliable and low cost sensor system and method for the detection of potential induced degradation ("PID") occurring in photovoltaics ("PV"). The system and method strive to provide the detection before a significant power loss occurs. A goal of the system and method is to enhance the failure monitoring of PV systems and to promote PV technology. The PID detection system and method operate in one embodiment online (in the field, e.g., at night) with the PV system.

The present PID detection system and method may operate with single cell PV modules and multiple cell PV modules. The system and method provide PID detection for installed outdoor PV systems and for PID compliance testing of new PV modules due its high sensitivity to PID. The sensor of the present system and method may be attached to selected PV modules and does not have to be attached to all PV modules of a PV string.

A goal of the system and method is to provide recovery from PID as early as possible, before PID progresses to a severe stage, in an attempt to recover the output of the PV modules to at or near 100%. The present sensor system warns owners of PV plants of the development of PID so that early recovery measures may be taken, which is needed for 100% recovery. In an embodiment, the present sensor system and method enables PID detection before 1% of PV power is lost.

The detection system and method is in one embodiment based on the measurement of a PV cell's shunt resistance via the injection of a low, direct current ("DC") signal, e.g., less than 10 mA, the testing for which is discussed herein. The low current signal allows for a low cost sensor having an electronic circuit and an embedded algorithm for determining the early onset of PID. The electronic circuit of the sensor isolates the PV module to be interrogated from the rest of the modules to take measurements. Once the interrogation is complete, the system reconnects the PV module to the string. Again, it is contemplated for the sensor to operate at night so as not to interrupt PV production during the day.

In one embodiment, a sensor of the present disclosure is provided for each PV module string. The sensor may be located at a negative voltage end of the PV string. That is, the string, which places the PV modules in series, has a positive voltage end and a negative voltage end. The PV module located at the negative voltage end is most prone to PID. Placing the sensor for operation with that PV module therefore acts as a protector for the entire string. The arrangement detects a worst case scenario.

As illustrated in detail herein, the sensor includes an electrical connection to the PV module. That electrical connection is placed in series electrical communication with the other PV modules of the string via electrical lines or electrodes located within the sensor. An isolation device is located along at least one of the electrical lines or electrodes placing the PV module in series with the rest of the PV modules of the string. At night, when it is time to test the PV module, the sensor, under control of a central processing unit ("CPU") of the sensor, causes the isolation device to isolate the interrogated PV module from the rest of the string. The CPU of sensor then interrogates the PV module, e.g., the shunt resistance of the PV module, after which the CPU causes the isolation device to put the interrogated PV module back online. In the morning, the entire PV string is fully ready for operation.

The sensor includes circuitry for electrically communicating with the interrogated PV module, circuitry for electrically communication with the string and the isolation device discussed above. In an embodiment, the sensor also includes a battery, which may be a replaceable battery or a rechargeable battery. If rechargeable, it is contemplated to electrically connect the rechargeable battery so as to be recharged within the sensor, e.g., off of the electrical string circuitry that carries the charge for the PV string.

The sensor may provide a power supply that powers the electronic components of the sensor and converts battery power into a voltage of a type and amount needed to test the interrogated PV module of the string. In an embodiment, the supply voltage is a DC voltage in an amount sufficient to deliver 10 mA or less to each of the equivalent shunt resistors (modeling shunt resistance) of the PV module, e.g., sixty or seventy-two equivalent shunt resistors for sixty or seventy-two cells, respectively, of the PV module.

The sensor also provides an electrical detector, such as a voltage detector, which is placed in electrical communication with an electrical signal line located within the sensor. The electrical signal line communicates with the PV module and receives the modulated voltage from the voltage supply. The CPU receives an output signal from the electrical detector and analyzes the signal to determine if the interrogated PV module is experiencing the onset of PID.

The sensor in one embodiment includes a temperature sensor, which measures the temperature of the interrogated PV module. The temperature sensor in various embodiments is a thermistor or thermocouple having leads that extend from the sensor and attach to an area of the PV module that is pertinent for temperature detection. The temperature is outputted to the CPU, which may be used in combination with the signal from the electrical detector to determine if the interrogated PV module is experiencing the onset of PID.

The sensor in an embodiment also includes a transceiver or other communication device for single or two-way communication to a central database and associated network. The sensor and potentially multiple sensors operating with different PV strings, output(s) to the central database server that interfaces with an online portal developed for the output of the detection results. The screen of the portal may, for example, show a representation of each of the PV module strings, and provide a risk assessment for each string. It is also contemplated for the processing associated with the central database server and online portal to monitor the reported results for each PV module string and to trend multiple results over multiple days. The processing evaluates the trends to make an estimation of when a particular PV module string will reach a threshold power loss, e.g., 1% of peak power. The estimation may, for example, be a number of days that is displayed in association with each cell or PV module. In this manner, the user can see how quickly a repair or recovery needs to be made before allowing a power loss to reach the threshold.

In light of the disclosure set forth herein, and without limiting the disclosure in any way, in a first aspect of the present disclosure, which may be combined with any other aspect described herein, a photovoltaic ("PV") sensor for the early detection of potential induced degradation ("PID") includes: a housing; a power source located within the housing; an electrical connection presented by the housing for electrically communicating the power source with a PV module; and wherein current supplied by the power source to the PV module is less than 10 mA.

In a second aspect of the present disclosure, which may be combined with any other aspect described herein, the electrical connection includes leads or contacts, plug-in connectors, or a plurality of electrical lines for connecting to the PV module.

In a third aspect of the present disclosure, which may be combined with any other aspect described herein, the PV sensor includes an electrical detector located within the housing, and wherein electrical lines in electrical communication with the electrical detector are placed in electrical communication with the PV module so as to measure at least one shunt resistance within the PV module.

In a fourth aspect of the present disclosure, which may be combined with any other aspect described herein, the PV sensor includes a central processing unit ("CPU") configured to perform an analysis of an output from the electrical detector, the output indicative of the at least one shunt resistance within the PV module, the CPU determining at least one of PID development or a percentage power loss of the PV module from the analysis.

In a fifth aspect of the present disclosure, which may be combined with any other aspect described herein, the analysis of the output from the electrical detector by the CPU assumes an illumination current provided by the PV module is zero.

In a sixth aspect of the present disclosure, which may be combined with any other aspect described herein, the PV sensor includes an isolation device configured to electrically isolate the PV module from the remainder of a PV string when the current is supplied by the power source to the PV module.

In a seventh aspect of the present disclosure, which may be combined with any other aspect described herein, the isolation device includes a switch or a metal-oxide-semiconductor field-effect transistor ("MOSFET").

In an eighth aspect of the present disclosure, which may be combined with any other aspect described herein, the PV sensor includes at least one of a cable for wired communication with a central server or a wireless communication device for wireless communication with a central server.

In a ninth aspect of the present disclosure, which may be combined with any other aspect described herein, the PV sensor is configured to automatically interrogate the PV module at night.

In a tenth aspect of the present disclosure, which may be combined with any other aspect described herein, a photovoltaic ("PV") sensor for the early detection of potential induced degradation ("PID") includes: a housing; a power source located within the housing; an electrical connection presented by the housing for electrically communicating the power source with a PV module; an electrical detector in electrical communication with the electrical connection; and a central processing unit ("CPU") configured to analyze an output from the electrical detector and determine, based on the output, a power loss of the PV module relative to a threshold power loss.

In an eleventh aspect of the present disclosure, which may be combined with any other aspect described herein, the threshold power loss is 1.0%.

In a twelfth aspect of the present disclosure, which may be combined with any other aspect described herein, a photovoltaic ("PV") assembly for the early detection of potential induced degradation ("PID") includes: a PV string including a plurality of PV modules; a sensor positioned and arranged to sense a PV module located at the negative voltage end of the PV string, the sensor including a housing, a power source located within the housing, and an electrical connection presented by the housing to electrically communicate the power source with the PV module located at the negative voltage end of the PV string for detecting at least one of PID development in or a percentage power loss of the PV module.

In a thirteenth aspect of the present disclosure, which may be combined with any other aspect described herein, current supplied by the power source to the PV module located at the negative voltage end of the PV string is less than 10 mA.

In a fourteenth aspect of the present disclosure, which may be combined with any other aspect described herein, the PV module located at the negative voltage end of the PV string includes a plurality of PV cells having shunt resistances in series electrical connection with the power source.

In a fifteenth aspect of the present disclosure, which may be combined with any other aspect described herein, the PV assembly includes an isolation device configured to electrically isolate the PV module located at the negative voltage end of the PV string from the remainder of the PV string when the PV module is interrogated by the sensor.

In a sixteenth aspect of the present disclosure, which may be combined with any other aspect described herein, the PV string is a first PV string and the sensor is a first sensor, which includes a second PV string including a plurality of PV modules, a second sensor positioned and arranged to sense a PV module located at the negative voltage end of the second PV string, and a central server, the first and second sensors configured to wired or wirelessly communicate PV string interrogation results to the central server.

In a seventeenth aspect of the present disclosure, which may be combined with any other aspect described herein, a photovoltaic ("PV") system for the early detection of potential induced degradation ("PID") includes: a sensor including a housing, a power source located within the housing, and an electrical connection presented by the housing for electrically communicating the power source with a PV module for detecting at least one of PID development in or a percentage power loss of the PV module; and a central server in data communication with the sensor, wherein the central server is configured to enable a display screen to be populated according to data outputted from the sensor.

In an eighteenth aspect of the present disclosure, which may be combined with any other aspect described herein, the PV system which includes a plurality of PV sensors in data communication with the central server, wherein the central server is configured to populate at least one display screen according to data outputted from the plurality of sensors.

In a nineteenth aspect of the present disclosure, which may be combined with any other aspect described herein, the central server is configured to produce at least one trend or determine at least pattern using a sensed shunt resistance of the PV module.

In a twentieth aspect of the present disclosure, which may be combined with any other aspect described herein, the display screen is configured to display at least one of a (i) shunt resistance or PV module power loss indicator or (ii) a time remaining to a shunt resistance or PV module power loss threshold indicator.

In a twenty-first aspect of the present disclosure, which may be combined with any other aspect described herein, the display screen includes a selectable icon representing the PV module, the display screen displaying additional information concerning the PV module when the selectable icon is selected.

In a twenty-second aspect of the present disclosure, any of the features, functionality and alternatives described in connection with any one or more of FIGS. 1 to 13 may be combined with any of the features, functionality and alternatives described in connection with any other of FIGS. 1 to 13.

It is accordingly an advantage of the present disclosure to provide a potential induced degradation ("PID") detection system and method for photovoltaics ("PV"), which increases PV reliability.

It is another advantage of the present disclosure to provide a PID detection system and method for PV that provides early recovery from PID, saving replacement costs.

It is a further advantage of the present disclosure to provide a PID detection system and method for PV that increases revenue for PV owners.

It is still another advantage of the present disclosure to provide a PID detection system and method for PV that increases the lifetime of PV modules.

It is yet a further advantage of the present disclosure to provide a PID detection system and method for PV that enhances green energy and reduces $CO_2$ emissions.

Additional features and advantages are described in, and will be apparent from, the following Detailed Description and the Figures. The features and advantages described herein are not all-inclusive and, in particular, many additional features and advantages will be apparent to one of ordinary skill in the art in view of the figures and description. Also, any particular embodiment does not have to have all of the advantages listed herein and it is expressly contemplated to claim individual advantageous embodiments separately. Moreover, it should be noted that the language used in the specification has been selected principally for readability and instructional purposes, and not to limit the scope of the inventive subject matter.

DETAILED DESCRIPTION

Figure 1:
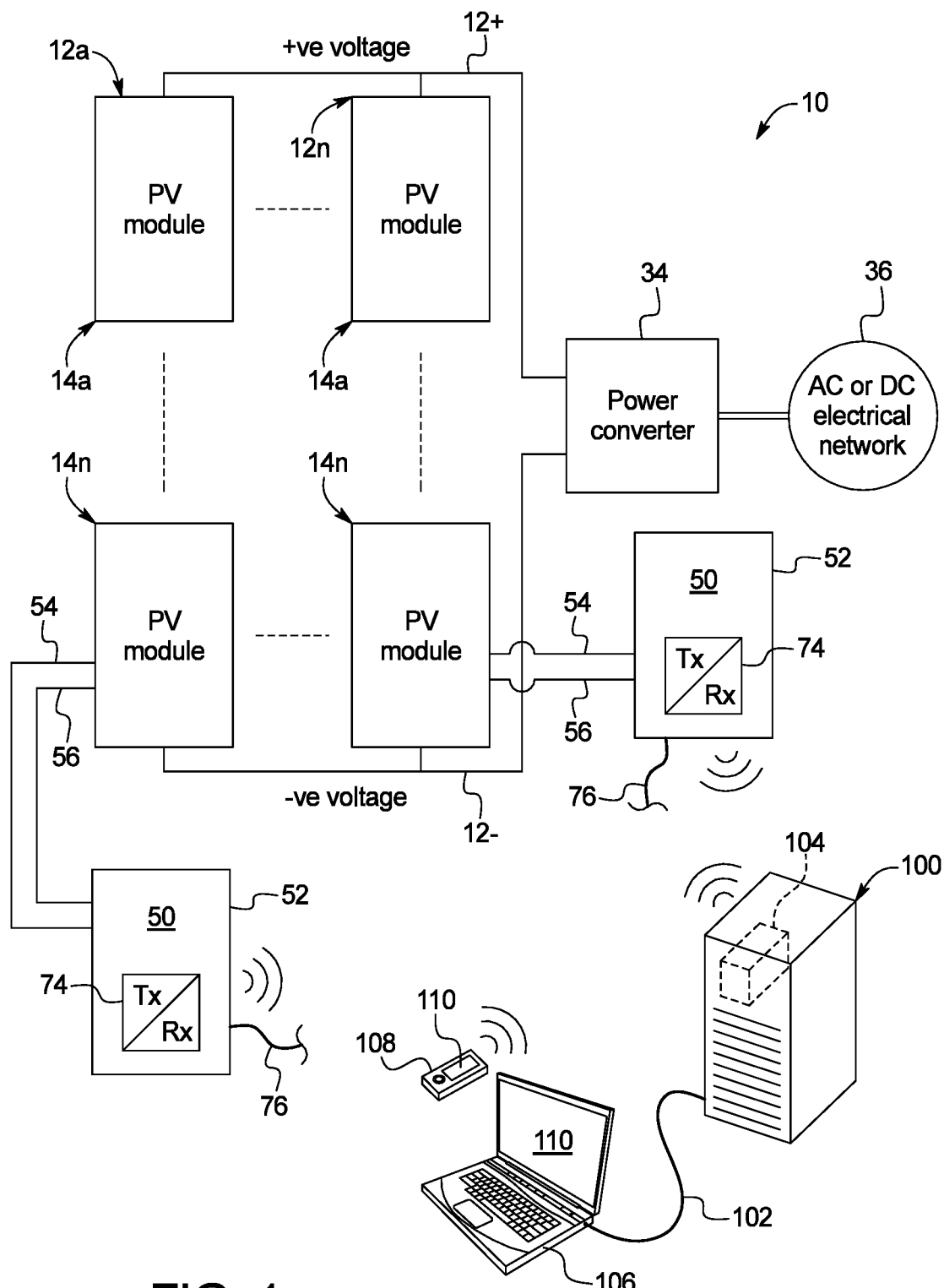
FIG. 1 is a schematic view of one embodiment of a photovoltaic ("PV") sensor system for the early detection of potential induced degradation ("PID") and associated methodology of the present disclosure operating with a plurality of PV modules and PV strings.

Referring now to the drawings and in particular to FIG. 1, an embodiment of a system 10 and associated methodology for early detection of potential induced degradation ("PID") is illustrated. FIG. 1 illustrates that sensor system 10 operates with one or more photovoltaic string 12a . . . 12n. Each photovoltaic string 12 may include a plurality of photovoltaic modules, e.g., modules 14a . . . 14n. As is typical in the industry, PV modules 14a to 14n in system 10 are connected electrically in series, while PV strings 12a to 12n are connected electrically in parallel.

PV strings 12a to 12n collect photovoltaically generated voltages across the ends 12+ and 12− of the strings, which is applied to a power converter 34, which converts the photovoltaically generated voltage into a form and amount desired by an AC or DC electrical network 36. It should therefore be appreciated that each string 12a to 12n has an associated negative voltage end 12− and a positive voltage end 12+.

Sensors 50 in the illustrated embodiment of FIG. 1 are located so as to interrogate PV module 14n, which is located at the negative voltage end 12− of the associated PV string 12a to 12n. The reason for this is that PV module 14n is most likely to develop potential induced degradation ("PID"). For early detection of PID, it is therefore best to interrogate PV module 14n located at the negative voltage end 12− of the string.

Sensors 50 each include a sensor housing 52, which may be a plastic or metal housing. Sensors communicate with interrogated PV module 14n via leads or contacts 54 and 56. Sensors 50 also communicate with a central database or server 100 a wired connection, e.g., via cable 76, and/or wirelessly, e.g., via a transceiver 74. Wired communication may be via Ethernet connection, for example. Wireless communication may be performed via any of Bluetooth™, WiFi™, Zigbee®, Z-Wave®, wireless Universal Serial Bus ("USB"), or infrared protocols, or via any other suitable wireless communication technology. Server 100 may include one or more servers including one or more processor and one or more memory. Server 100 includes a cable 102 for wired communication and/or a transceiver 104 for wireless communication.

Server 100 outputs locally or remotely to one or more personal computer 106 and/or smart device 108, such as a smartphone or tablet. Computer 106 and smart device 108 each include a display screen 110 for providing analyzed and compiled results from the outputs of sensors 50 to a user. Sensor 50 and server 100 are discussed in more detail below.

Figure 2:
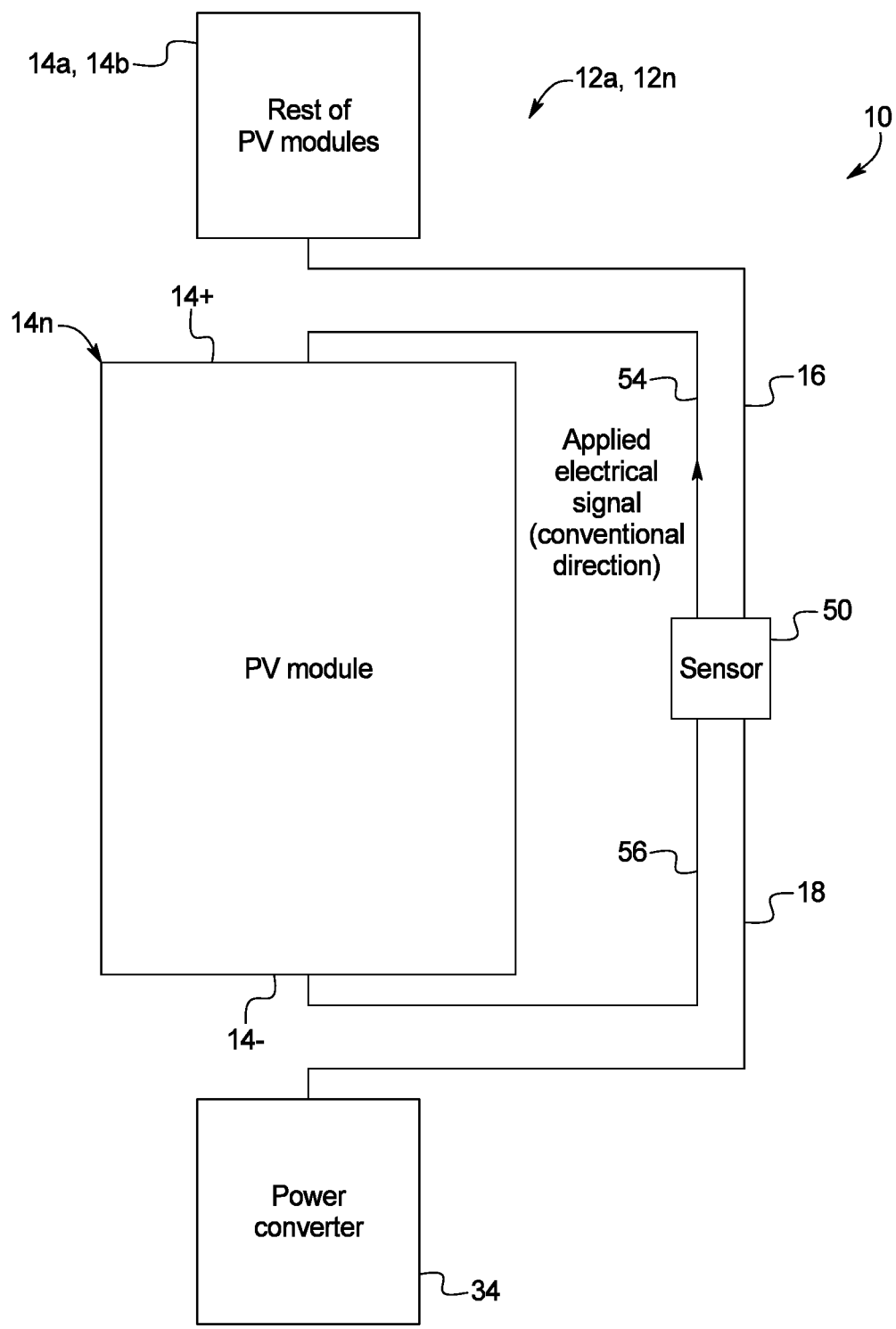
FIG. 2 is a top plan view of a sensor of the present disclosure operating with a PV module of a PV string.

FIG. 2 illustrates the electrical communication between sensor 50 and the interrogated PV module 14n in more detail. A positive sensor line 54 supplies an applied electrical signal to a positive lead 14+ of PV module 14n, while a negative sensor line 56 returns the applied electrical signal from negative lead 14− of PV module 14n to sensor 50.

FIG. 2 also illustrates the electrical communication between sensor 50 and the rest of PV string 12a, 12n in more detail. A string line 16 extends from sensor 50 to the next adjacent PV module 14a, 14b. A similar string line 16 runs between each of the PV modules 14a to 14n of the PV string 12a, 12b so as to connect the strings in series. FIG. 2 illustrates an embodiment wherein only a single PV string 12a or 12b is provided. In such a case, sensor 50 may include one or more power converter line 18 extending to power converter 34 for supplying photovoltaically generated string voltage to the converter.

Figure 3:
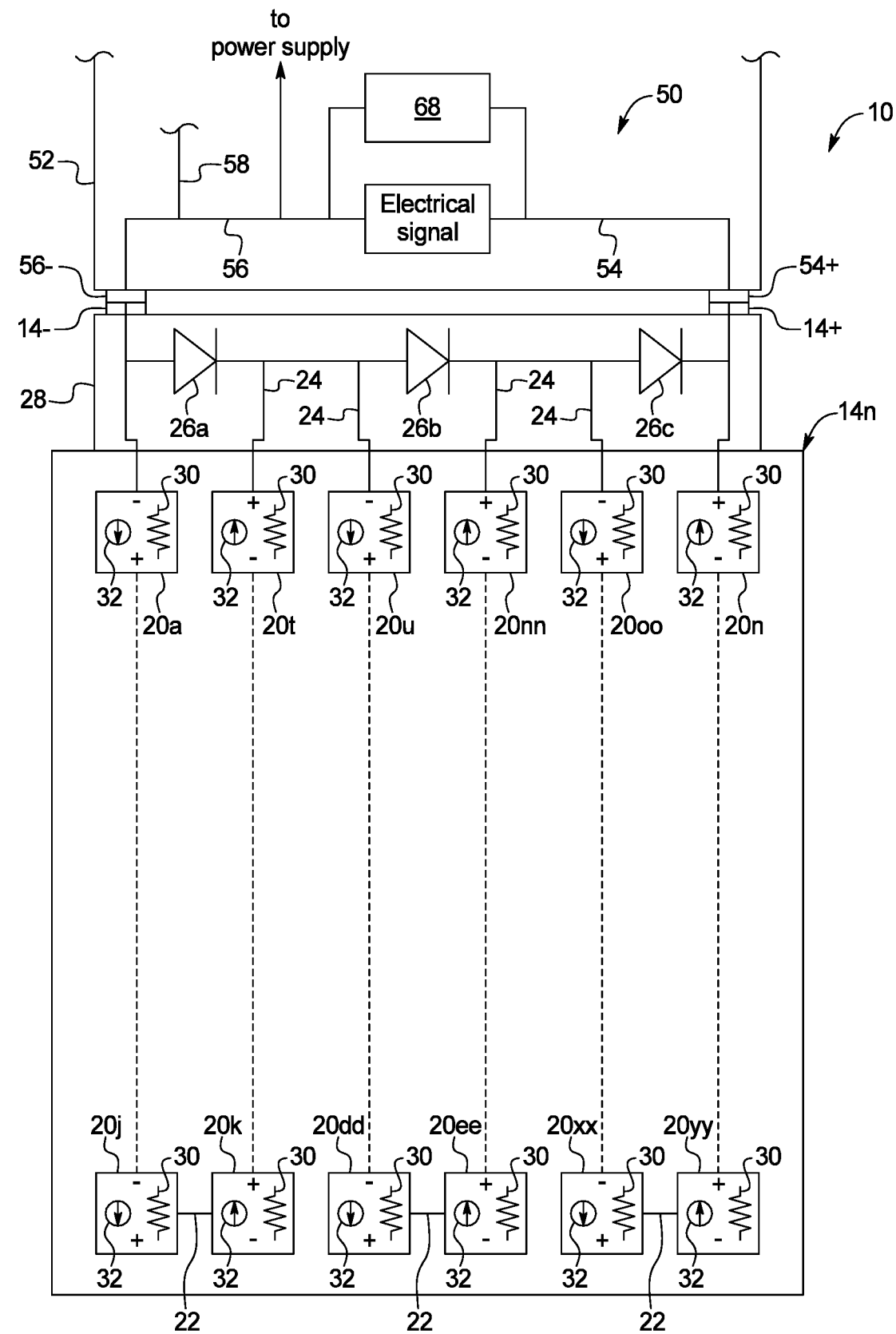
FIG. 3 a top plan view of one embodiment of a PV module interrogated via a sensor of the present disclosure, the PV module including multiple PV cells each having an inherent shunt resistance illustrated as an equivalent shunt resistor connected electrically in series with equivalent shunt resistors of the other PV cells.

FIG. 3 illustrates PV modules 14a to 14n in more detail. While interrogated PV module 14n is illustrated in FIG. 3, it should be appreciated that the teachings of FIG. 3 apply to each of the PV modules 14a to 14n of each of the strings 12a to 12n. PV module 14n in FIG. 3 is highlighted to illustrate that any PV module 14a to 14n may include multiple photovoltaic cells, e.g., PV cells 20a to 20n. The dotted lines between the PV cells indicate that any number of PV cells may reside therein. It is typical for PV modules 14a to 14n to provide six columns of PV cells as illustrated, wherein each column may include ten (as numbered alphanumerically in FIG. 3) or twelve PV cells, totaling sixty or seventy-two PV cells per PV module 14a to 14n.

The series connection of PV cells 20a to 20n is facilitated by electrical connections, e.g., printed circuit board traces, between the PV cells of a same column, electrical lines 22 at the lower ends of, and connecting pairs of, columns of PV cells 20a to 20n, and electrical lines 24 connecting the columns of PV cells 20a to 20n, which are not connected by electrical lines 22, between diodes 26a to 26c located within a junction box 28 provided along a side, e.g., back, of PV module 14n. Diodes 26a to 26c (less or more than three may be provided) force current to flow in a desired direction. Diodes 26a to 26c protect PV cells 20a to 20n from reverse bias voltages due for example to human mistake or shading (obstruction of sunlight by physical objects such as trees, buildings, clouds, etc.). In the case of shading, the diodes 26a to 26c protect the PV cells 20a to 20n from damage due to reverse bias voltage and also provide an electrical path for the unshaded PV modules 14a to 14n of the string 12a to 12n to continue supplying power.

In FIG. 3, negative lead or terminal 14− of PV module 14n extends conductively to the first PV cell 20a of the module, while positive lead or terminal 14+ of PV module 14n extends conductively to the last PV cell 20n of the module. Terminals 14− and 14+ of PV module 14n are also respectively electrically connected to diodes 26a and 26c.

Positive sensor line 54 and negative sensor line 56 of sensor 50 in FIG. 3 terminate respectively at positive terminal 54+ and negative terminal 56− at housing 52 of sensor 50. Positive terminal 54+ and negative terminal 56− of sensor 50 are placed in respective electrical connection with positive terminal 14+ and negative terminal 14− of PV module 14n if housing 52 is mounted to junction box 28 of the module. In the embodiment of FIG. 3, external wiring of sensor 50 to PV module 14n (except perhaps for temperature sensor probe wires discussed below) is not needed.

It certain preferred embodiments, sensor 50 is installed near PV module 14n or attached at the back of the module. Electrical plug-in connectors (not illustrated) may be provided on housing 52 of sensor 50 for receiving PV module 14n connectors and PV string 12a to 12n connectors, which may conveniently be of the plug-in type.

Each PV cell 20a to 20n may be modeled as having an illumination current source, a p-n junction diode, a shunt resistor and a series resistor. FIG. 3 illustrates an equivalent (not actual) shunt resistor 30 and an equivalent (not actual) equivalent illumination current source 32 for each cell 20a to 20n. Equivalent illumination current source 32 in an embodiment supplies a current $I_L$ in proportion to solar irradiation received by the PV cell. As discussed in detail below, the testing of one or more PV string 12a to 12n is performed at night, e.g., under "dark" conditions, such that the output of equivalent illumination current source 32 is zero.

The sensing and testing of system 10 takes into account that a lowered shunt resistance $R_{sh}$ of equivalent shunt resistor 30 causes power losses in PV cells 20a to 20n by providing an alternate current path for the light-generated current at equivalent illumination current source 32. The diversion reduces the amount of current on the output terminals of the effected PV cell and the power generated by the cell. The effect of a lowered shunt resistance $R_{sh}$ may be particularly severe at low light levels, since there is less light-generated current, wherein loss of current through equivalent shunt resistor 30 has a larger impact.

System 10 accordingly provides sensor 50, which measures the collective shunt resistance $R_{sh}$ of equivalent shunt resistors 30 of PV cells 20a to 20n to evaluate whether PV module 14n is experiencing the onset of PID. Equivalent shunt resistors 30 of PV cells 20a to 20n, like the PV cells themselves, are electrically connected in series within PV module 14n. Applying a measurement current from sensor 50 at positive terminal 14+, flowing the current through the equivalent shunt resistors 30 of each of PV cells 20a to 20n, and returning the measurement current to sensor 50 via negative terminal 14− of PV module 14n, enables the collective shunt resistance $R_{sh}$ to be measured. And as discussed above, by locating sensor 50 for operation with PV module 14n at the associated negative voltage end 12− of a string 12a to 12n enables sensor 50 to be the protector for the entire string because the negative voltage end 12− is where the onset of PID is, or most likely, takes place.

Figure 4:
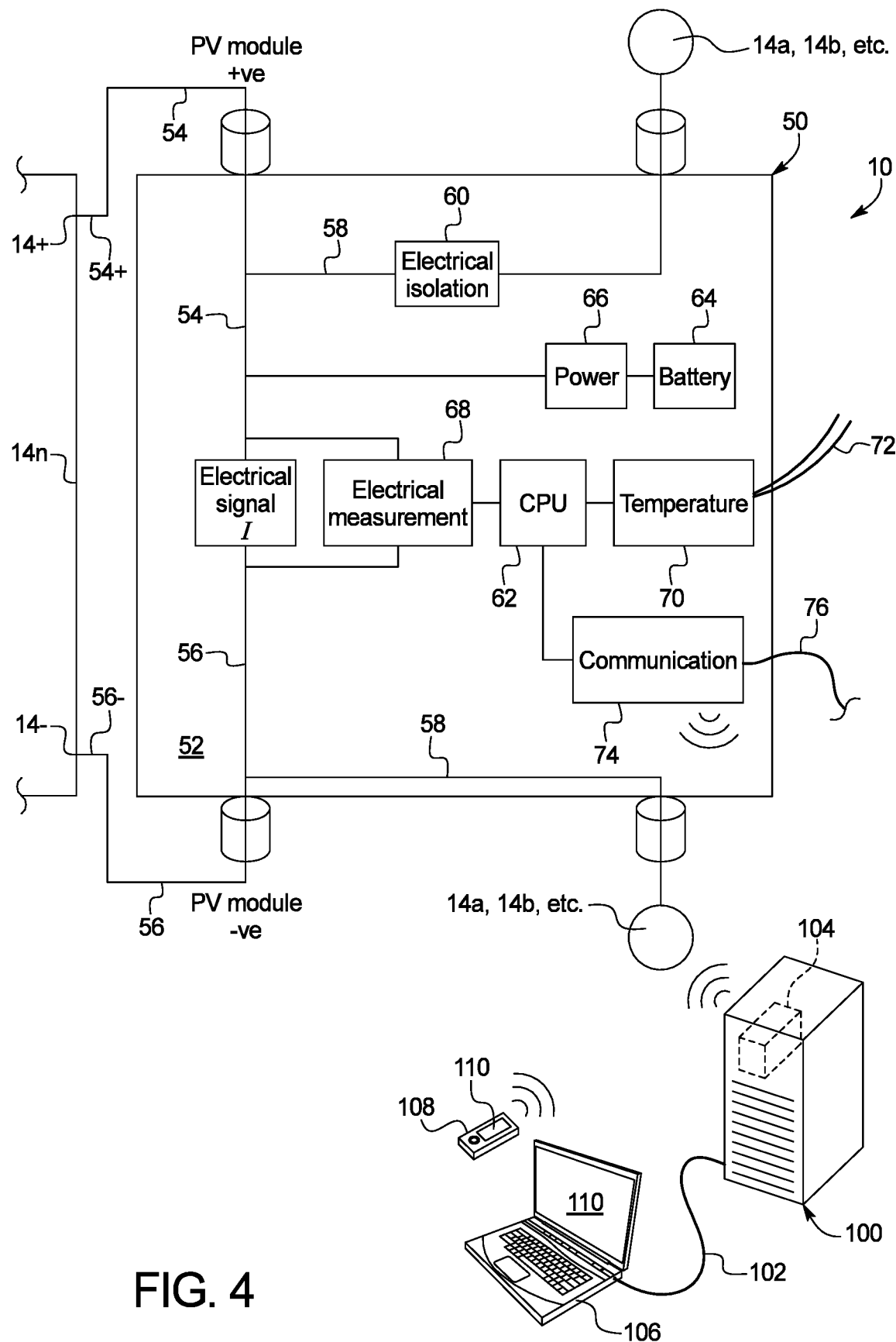
FIG. 4 is a top view of one embodiment of a PV module interrogation sensor of the present disclosure.

FIG. 4 illustrates sensor 50 and its connection to PV module 14n in more detail. Sensor 50 as discussed above includes a housing 52, such as a plastic or metal housing. As illustrated in FIG. 4, sensor 50 includes negative terminal 56− of negative sensor line 56 connecting to negative terminal 14− of PV module 14n, while positive terminal 54+ of positive sensor line 54 connects to positive terminal 14+ of the module. Here, unlike in FIG. 3, sensor 50 may include one or more cable that brings positive and negative lines 54 and 56 to PV module 14n. The electrical connection of sensor 50 to PV module 14n places PV module 14n in series electrical communication with the other PV modules 14a, 14b, etc., of the string 12a to 12n via electrical lines or electrodes 58 located within the sensor. It should be appreciated that electrical lines or electrodes 54, 56, 58 (and any other lines or electrodes of sensor 5) may be formed via traces applied to a printed circuit board, which also mounts the components of sensor 50.

An isolation device 60 is located along at least one of the electrical lines or electrodes 58 placing PV module 14n in series with the rest of the PV modules 14a, 14b, etc., of string 12a to 12n. Isolation device 60 may be any type of electrical device that can open an electrical line or circuit, such as a switch or metal-oxide-semiconductor field-effect transistor ("MOSFET"), which is under control of a central processing unit ("CPU") 62 having one or more memory and one or more processor.

At night, when it is time to test the PV module 14n, CPU 62 causes isolation device 60 to isolate interrogated PV module 14n from the rest of the modules 14a, 14b, etc., of string 12a to 12n. CPU 62 of sensor 50 then interrogates PV module 14n, e.g., the shunt resistance $R_{sh}$ of series equivalent shunt resistors 30 of PV module 14n, after which CPU 62 causes isolation device 60 to place interrogated PV module 14n back online. In the morning, the entire PV string 12a to 12n is fully ready for operation.

FIG. 4 illustrates that sensor 50 in an embodiment also includes a battery 64, which may be a replaceable battery or a rechargeable battery. If replaceable, housing 52 provides a removable cover to exchange batteries 64. If rechargeable, it is contemplated to electrically connect rechargeable battery 64 so as to be recharged within sensor 50, e.g., off of the electrical string circuitry that carries the charge for the PV string 12a to 12n.

In the illustrated embodiment of FIG. 4, sensor 50 includes a power supply 66 that powers all electronic components of sensor 50 and converts battery power into a voltage of a type and amount needed to test interrogated PV module 14n of string 12a to 12n. In an embodiment, that supply voltage is a DC voltage in an amount sufficient to deliver 10 mA or less to each of the equivalent shunt resistors 30 of the PV module 14n, e.g., sixty or seventy-two shunt resistors for sixty or seventy-two cells 20a to 20n, respectively, of the PV module 14n. Additionally, power supply 66 powers all sub-circuits of sensor 50 and may also charge battery 64 during the day while there is PV production. In one embodiment, power supply 66 during the night supplies all sub-circuits of sensor 50 via the stored energy from battery 64. It should also be appreciated that where wired communication is used with sensor 50, power may also be supplied along the same communication cable 76. In such case, battery 64 may not be required.

As described above, PV module 14n may include a differing amounts of PV cells 20a to 20n, e.g., sixty to seventy-two cells. It is contemplated that system 10 supply a detection or interrogation voltage to PV module 14n that results in a current being supplied to the PV cells 20a to 20n, which falls within an acceptable range, e.g., less than 10 mA, regardless of the number of PV cells. If a situation arises in which the number of PV cells varies to an extent that a single voltage will not result in an acceptable voltage for each variety of PV module, sensor 50 in one embodiment has the ability to vary the detection or interrogation voltage based on the number of PV cells 20a to 20n of the PV module 14n. Here, the detection or interrogation voltage be set manually, e.g., via switch selection in sensor 50, or automatically, e.g., sensor 50 runs a test voltage to determine how many PV cells exist and sets the detection or interrogation voltage accordingly. In another embodiment, different sensors 50 providing different set detection or interrogation voltages are provided for different PV modules.

In the illustrated embodiment of FIG. 4, sensor 50 also includes an electrical detector 68, such as a voltage detector, which is placed in electrical communication with electrical signal line 54, 56 located within the sensor. Electrical signal line 54, 56 communicates with PV module 14n and receives a modulated and desired voltage from power supply 66. CPU 62 receives an output signal from electrical detector 68 and analyzes the signal to determine if interrogated PV module 14n is experiencing the onset of PID.

Sensor 50 in the illustrated embodiment of FIG. 4 includes a temperature sensor 70, which measures the temperature of interrogated PV module 14n. Temperature sensor 70 in various embodiments is a thermistor or thermocouple having leads 72 that extend from the sensor and attach to an area of PV module 14n that is pertinent for temperature detection, e.g., in the center of the PV module 14n at its back side. The measured temperature is outputted to CPU 62, which may be used in combination with the signal from electrical detector 68 (i) determine if the sensed temperature is within a proper range for accurate shunt resistance $R_{sh}$ or power loss detection, and/or (ii) as a temperature correction (e.g., empirically determined) for shunt resistance $R_{sh}$ or power loss.

Sensor 50 in an embodiment also includes a transceiver or other wireless communication device 74 for single or two-way communication to central database server 100 and its associated network. Sensor 50 and potentially multiple sensors 50 operating with different PV strings 12a to 12n, output(s) to central database server 100. Server 100 may be a cloud server and/or be located at a building belonging to the provider of system 10. Sensor 50 may alternatively or additionally include a wired communication interface 76, e.g., an Ethernet connection, for wired communication with central database server 100, for example, when central database server 100 and PV strings 12a to 12n are located within a same facility. In any case, central database server 100 provides an online portal developed to output detection results to one or more user.

The interrogation by sensor 50 of PV module 14n occurs at night so that illumination current IL from equivalent current source 32 is zero, and while electrical signal line 54, 56 is isolated from the rest of string 12a to 12n via isolator 60, such that the only current running through equivalent shunt resistors 30 of PV module 14n is the test current supplied by power supply 66. The shunt resistance $R_{sh}$ of each shunt resistor 28 at full strength is known and thus the overall series shunt resistance at full strength of PV module 14n is known and expected. The voltage supplied by power supply 66 to achieve a desired forward bias current I is of an amount that assumes each of equivalent shunt resistors 30 to be at full strength. When the voltage is supplied by power supply 66, the desired forward bias current I is introduced along electrical signal line 54, 56, which as illustrated in FIG. 3 extends through all PV cells 20a to 20n of PV module 14n. Electrical detector 68 detects an electrical parameter, such as voltage, which reflects the actual shunt resistance $R_{sh}$ of PV module 14n as determined by CPU 62. If the actual overall shunt resistance of PV module 14n is less than the expected overall shunt resistance (or associated power loss) by at or more than a threshold, e.g., 1.0%, as compared by CPU 62, then CPU 62 outputs an alert, alarm, warning, etc., wired or wirelessly to display screen 110 of personal computer 106 and/or smart device 108 as discussed in more detail below. If the actual overall shunt resistance (or associated power loss) of PV module 14n is within the expected threshold, e.g., within 1.0%, CPU 62 may nevertheless provide a wired or wireless output to display screen 110 of personal computer 106 and/or smart device 108 as discussed in more detail below.

The inventors of the present disclosure have found that an optimal forward current I for early detection of PID at a single cell, such as cell 20a of FIG. 3, via the measurement of shunt resistance $R_{sh}$, e.g., prior to one percent power loss, is less than 10 mA. As set forth by the inventors in *Early Detection of Potential Induced Degradation by Measurement of the Forward DC Resistance in Crystalline PV Cells*, IEEE JOURNAL OF PHOTOVOLTAICS, March 2019, the entire contents of which are incorporated herein by reference and relied upon, they have found that using the forward DC resistance ("FDCR") of a PV cell, such as cell 20a, is beneficial because it is a parameter that is affected by the cell's shunt resistance $R_{sh}$. It has been found that that monitoring the FDCR at low forward bias conditions (forward bias current I in FIG. 2) provides a reliable method for PID detection before any significant power loss occurs (e.g., less than 1%). To detect PID in a PV cell before 1% power is lost, the FDCR should be measured at a forward bias current of less than 10 mA. Earlier detection is also possible with even lower forward bias currents. Besides $R_{sh}$, the present inventors have examined the effects of reverse dark saturation current $I_0$, and ideality factor (n) on the FDCR since both of those parameters are affected by PID. The main contributor to the FDCR variation with PID has been found, however, to be shunt resistance $R_{sh}$. Experimental results have verified that the lower the bias current when measuring the FDCR, the more sensitive the PID monitoring is (for detecting PID at an earlier stage). It should be appreciated that while testing has been performed under full dark conditions, PID system 10 and its associated methodology does not require full dark current-voltage ("IV") curves.

Figure 5:
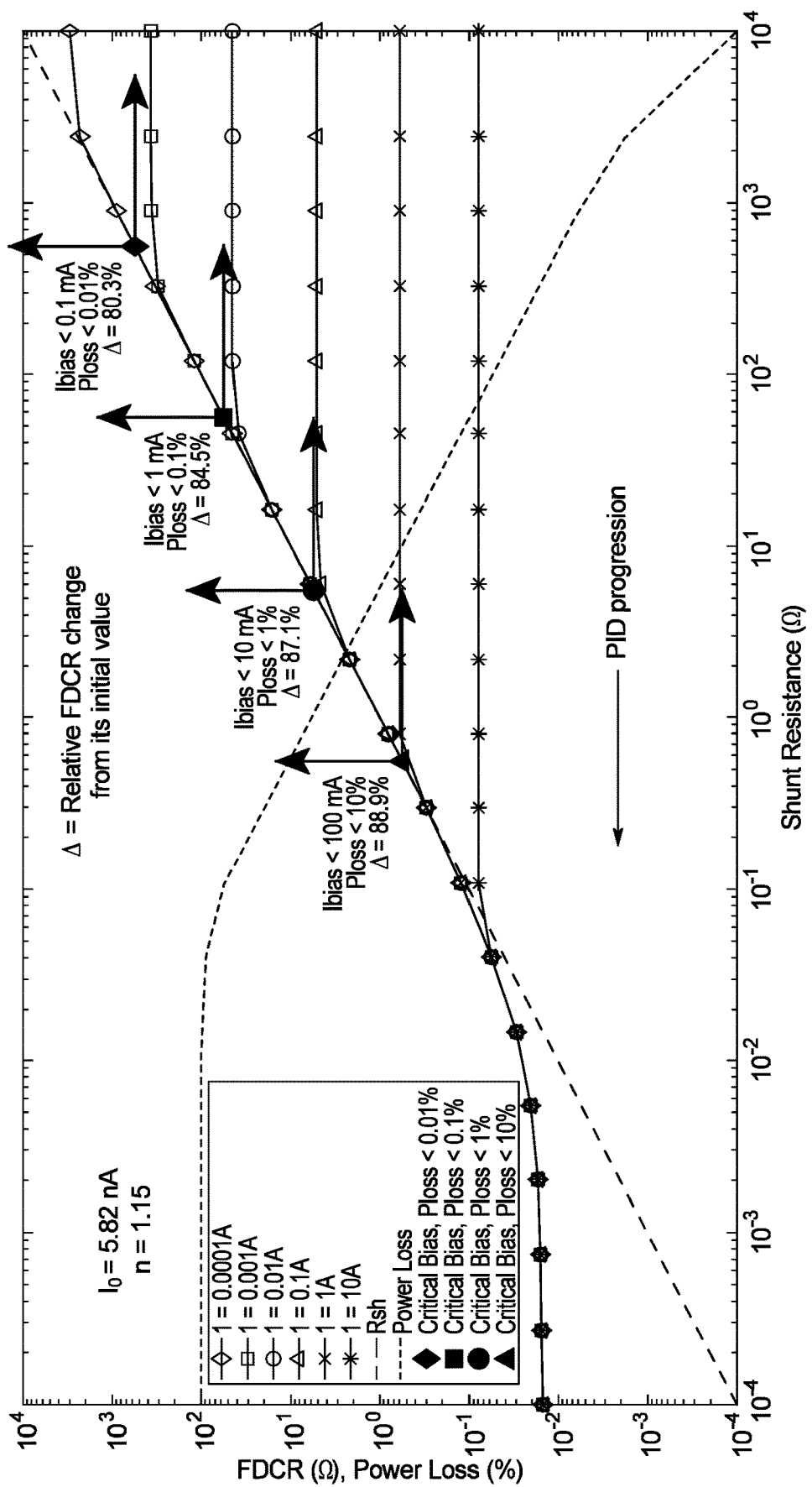
FIG. 5 is a graph illustrating FDCR and percentage PV cell power loss ("$P_{loss}$") against shunt resistance $R_{sh}$ for various values of forward bias current I for the system and methodology of the present disclosure.

FIG. 5 illustrates FDCR and percentage PV cell power loss ("$P_{loss}$") against shunt resistance $R_{sh}$ for various values of forward bias current I. The initial PV cell output power is 3.2 W. The more the PID progresses (see progression arrow), the lower the shunt resistance $R_{sh}$. FIG. 5 also illustrates that the measured FDCR matches the shunt resistance. Critical bias current values to detect PID before various power losses (0.01% to 10%) are shown by the arrows. Forward bias current I less than 10 mA is shown to detect power loss less than 1%.

Figure 6:
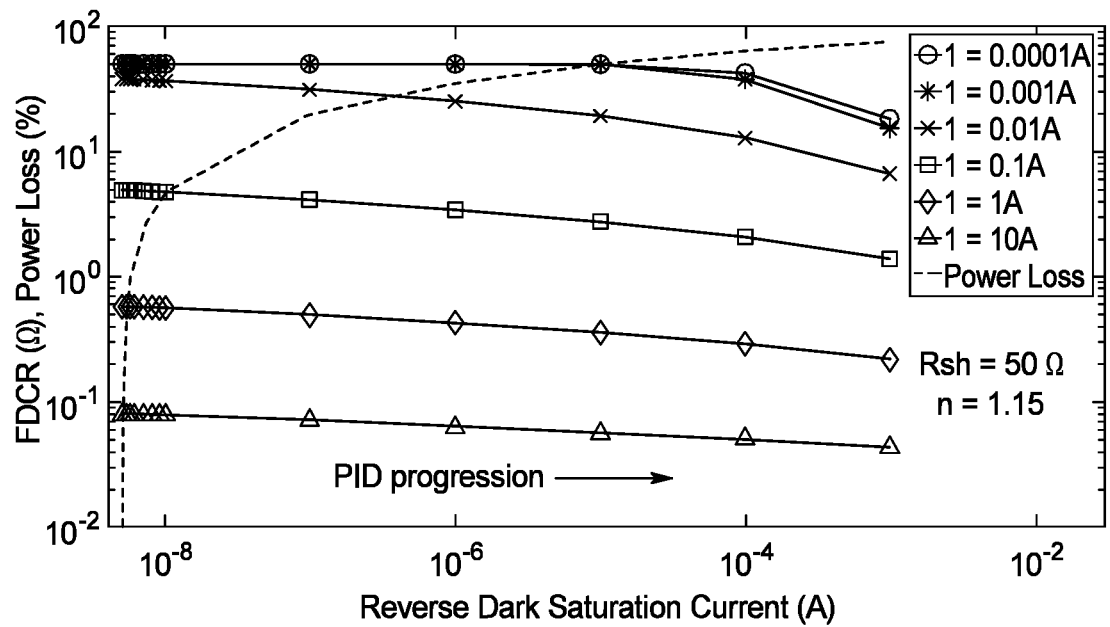
FIG. 6 is a graph illustrating FDCR and percentage cell power loss (Ploss) against a reverse dark saturation current $I_0$ for various values of forward bias current I for the system and methodology of the present disclosure.
Figure 7:
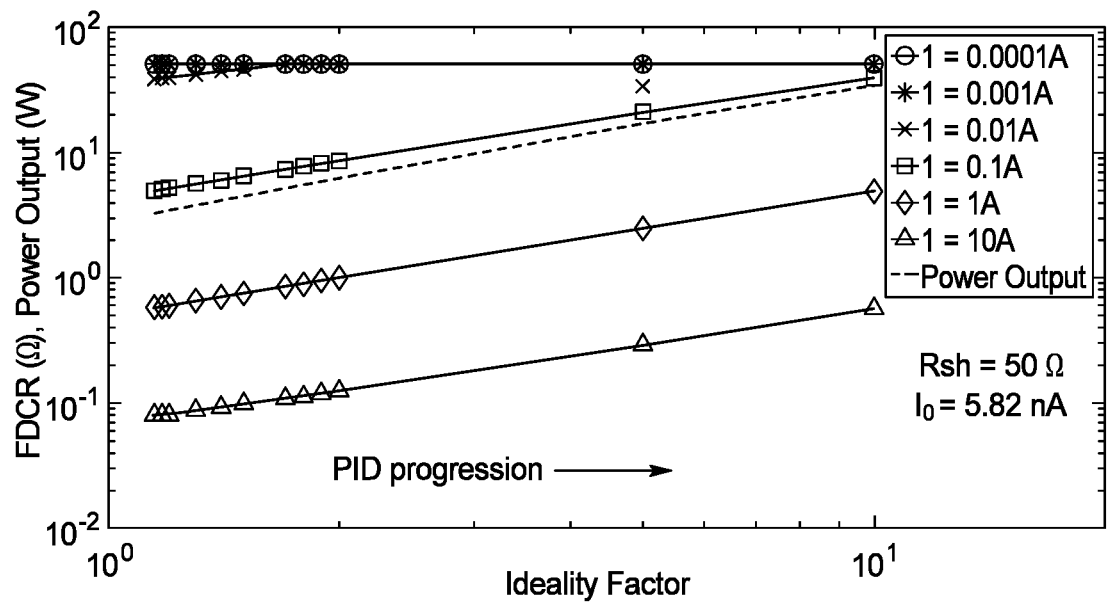
FIG. 7 is a graph illustrating FDCR and percentage cell power loss (Ploss) against an ideality factor (n) for various values of forward bias current I for the system and methodology of the present disclosure.
Figure 8:
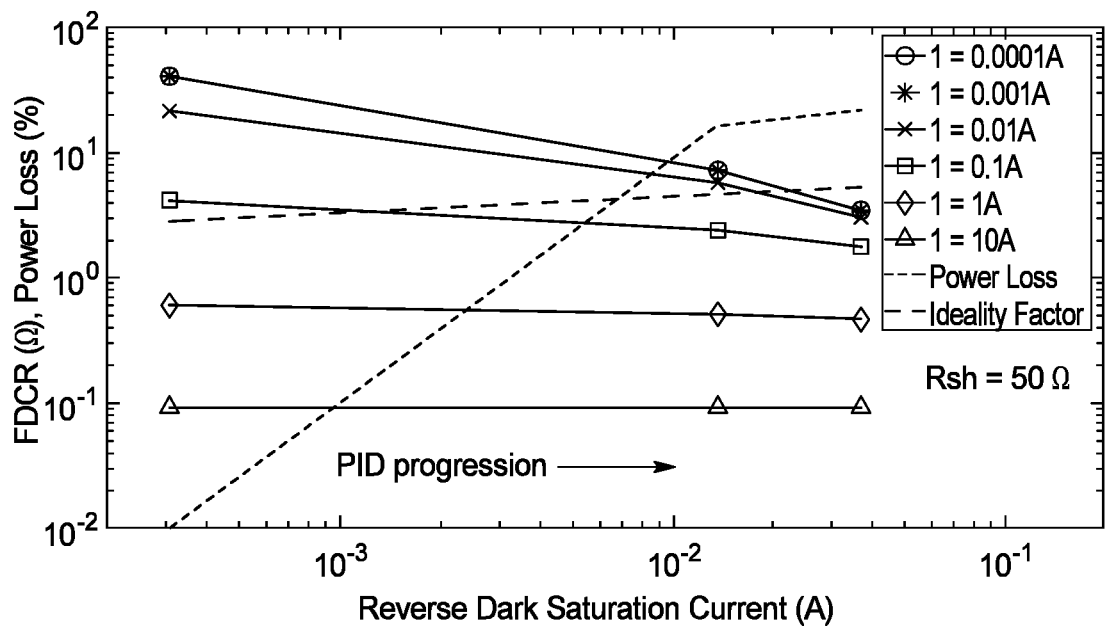
FIG. 8 is a graph illustrating FDCR and percentage cell power loss (Ploss) against the reverse dark saturation current $I_0$ and ideality factor (n) for various values of forward bias current I for the system and methodology of the present disclosure.

FIGS. 6 to 8 analyze other known parameters affected by PID, namely, reverse dark saturation current $I_0$ and ideality factor (n). FIG. 6 illustrates FDCR and percentage cell power loss (Ploss) against the reverse dark saturation current $I_0$ for various values of forward bias current I. In FIG. 6, the initial PV cell output power is 3.2 W. FIG. 6 shows that as dark saturation current $I_0$ increases with PID progression, the FDCR decreases. However, the FDCR variation before the power loss reaches 1% is insignificant and therefore the contribution of the reverse dark saturation current to PID detection (FDCR variation) at an early stage goal of system 10 is negligible.

FIG. 7 illustrates FDCR and percentage cell power loss (Ploss) against the ideality factor (n) for various values of forward bias current I. The initial cell output power is again 3.2 W. FIG. 7 illustrates that when PID increases due to increased ideality factor (n), the FDCR and PV cell output power also increase. Ideality factor (n) is accordingly likewise not a workable parameter to monitor for early PID detection.

FIG. 8 illustrates FDCR and percentage cell power loss (Ploss) against the reverse dark saturation current $I_0$ and ideality factor (n) for various values of forward bias current I. The initial PV cell output power here is 4.1 W. FIG. 8 illustrates that the reverse dark saturation current $I_0$ and the ideality factor (n) effectively change at the same time. The combined effect is a slower degradation rate that the one presented in FIG. 6. At high bias current conditions (e.g., >0.5 A), the change on the FDCR is insignificant. At low bias current conditions (e.g., <0.01 A), the FDCR change is more significant and adds positively to the reduction caused by the shunt resistance (see FIG. 5) for PID detection. This is due to the exponential behavior of the cell p-n junction. The main parameter that affects the FDCR is the PV cell shunt resistance $R_{sh}$. The reverse dark saturation current $I_0$ and the ideality factor (n) partially counter-balance their effect resulting in less change on the FDCR.

Figure 9:
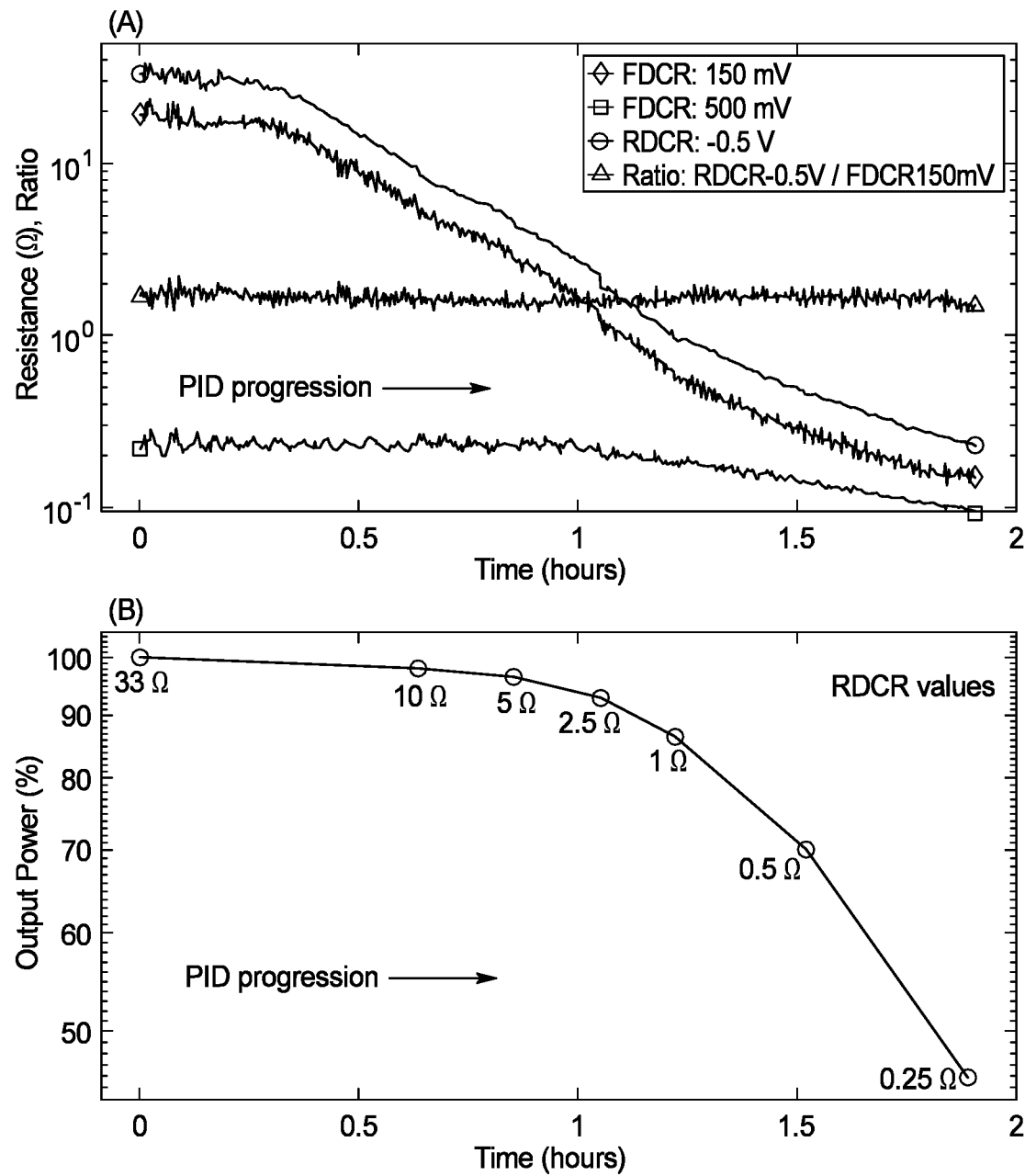
FIG. 9 includes graphs illustrating experiments performed to verify the above results for the early detection of PID for the system and methodology of the present disclosure.

FIG. 9 illustrates two plots (A) and (B). Plot (A) shows FDCR and reverse dc resistance ("RDCR") at different bias conditions, while plot (B) illustrates cell output power ($P_{out}$) against PID progression. FDCR and RDCR for plot (A) are measured at a cell temperature ($T_{cell}$) of 60° C., while the initial PV cell power is again 3.2 W. The ratio of the RDCR at −0.5 VDC to the FDCR at 150 mV is also illustrated. FIG. 9 shows experiments performed to verify the above results for the early detection of PID. Here, the PID progression is monitored by measuring the FDCR and the RDCR. It is observed in FIG. 9 that the RDCR of the cell decreases fast at the beginning as PID progresses while the output power of the cell (Pout) does not change significantly. A similar observation is observed for the FDCR at 150 mV, whereas the FDCR at 500 mV does not change until a significant amount of power is lost. The output of FIG. 9 shows that the concept of measuring the FDCR at low bias conditions for the early detection of PID is verified.

Figure 10:
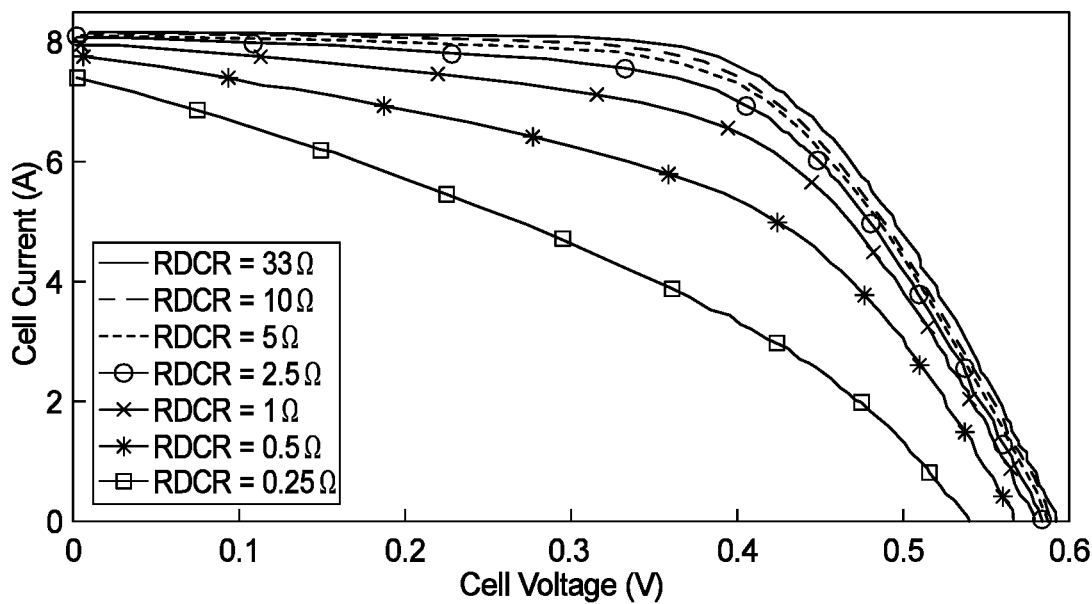
FIG. 10 is a graph illustrating light IV curves for various reverse DC resistance RDCR values for the system and methodology of the present disclosure.

FIG. 10 illustrates light IV curves for various reverse DC resistance RDCR values, and in particular the light IV curves used to obtain the maximum output power of the cell ($P_{out}$) at each RDCR with PID progression. The first parameter that changes with PID progression is the fill factor (FF) followed by the open-circuit voltage ($V_{oc}$).

Figure 11:
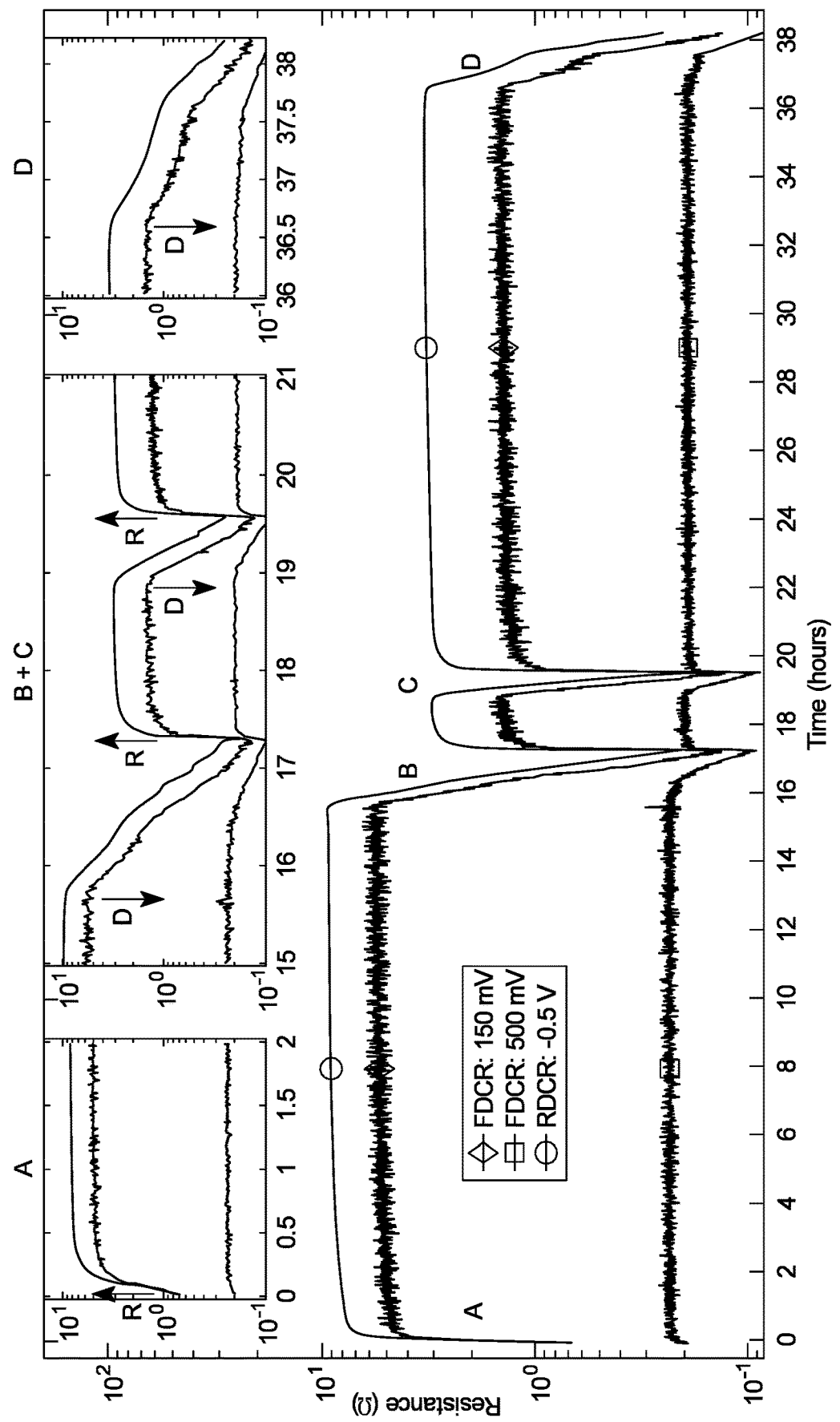
FIG. 11 includes graphs illustrating FDCR and RDCR at different bias conditions against PID progression for the system and methodology of the present disclosure.

To demonstrate the robustness of system 10 and its associated methodology, the interrogated PV cell is subjected to a series of PID recovery/degradation cycles as shown in FIG. 11. FIG. 11 in particular illustrates FDCR and RDCR at different bias conditions against PID progression. The PID progression is a combination of recovery (R arrow, increasing $R_{sh}$) and degradation (D arrow, decreasing $R_{sh}$) at +1000 VDC and −1000 VDC, respectively at 60° C. Subplots A, B to C, and D are exploded views of the corresponding A, B to C and D areas of the main plot, respectively. As illustrated, recovery/degradation starts at points denoted by R/D and continues until the next R/D event. The FDCR and RDCR are again measured at a PV cell temperature of 60° C., while the initial cell power is 3.2 W.

The test for the results shown in FIG. 11 was performed twenty-one days after the initial test to obtain the results in FIG. 9 (day 1), that is, the first degradation test of FIG. 9 was performed twenty-one days prior to the series of recovery/degradation cycles of FIG. 11. From day 1 to day 21, the PV cell was left at room temperature (15 to 18° C.) to recover slowly and to illustrate how the proposed detection method performs after different degradation stages. The recovery of the cell after day 21 is performed using a voltage of +1000 VDC at 60° C. FIG. 11 illustrates that the recovery of the PV cell occurs in less than fifteen minutes.

From the test of FIG. 11, it is shown that the proposed detection method at low bias conditions is able to capture both the degradation and recovery processes independently of the PID history of the PV cell, i.e., is not dependent on whether the cell has been subjected to slow (0 VDC HV bias) or fast (+1000 VDC HV bias) recovery or on the duration (several days or a few hours) of the recovery process. Another useful result that can be deduced from the graphs of FIG. 11 is the progression rate of the FDCR at 150 mV and the RDCR with PID. Their ratio when calculated yields a constant value (see FIG. 9). This indicates that the same mechanism (PV cell shunt resistance $R_{sh}$) at low bias conditions drives the observed changes in both the forward (FDCR) and reverse (RDCR) bias measurements.

Figure 12:
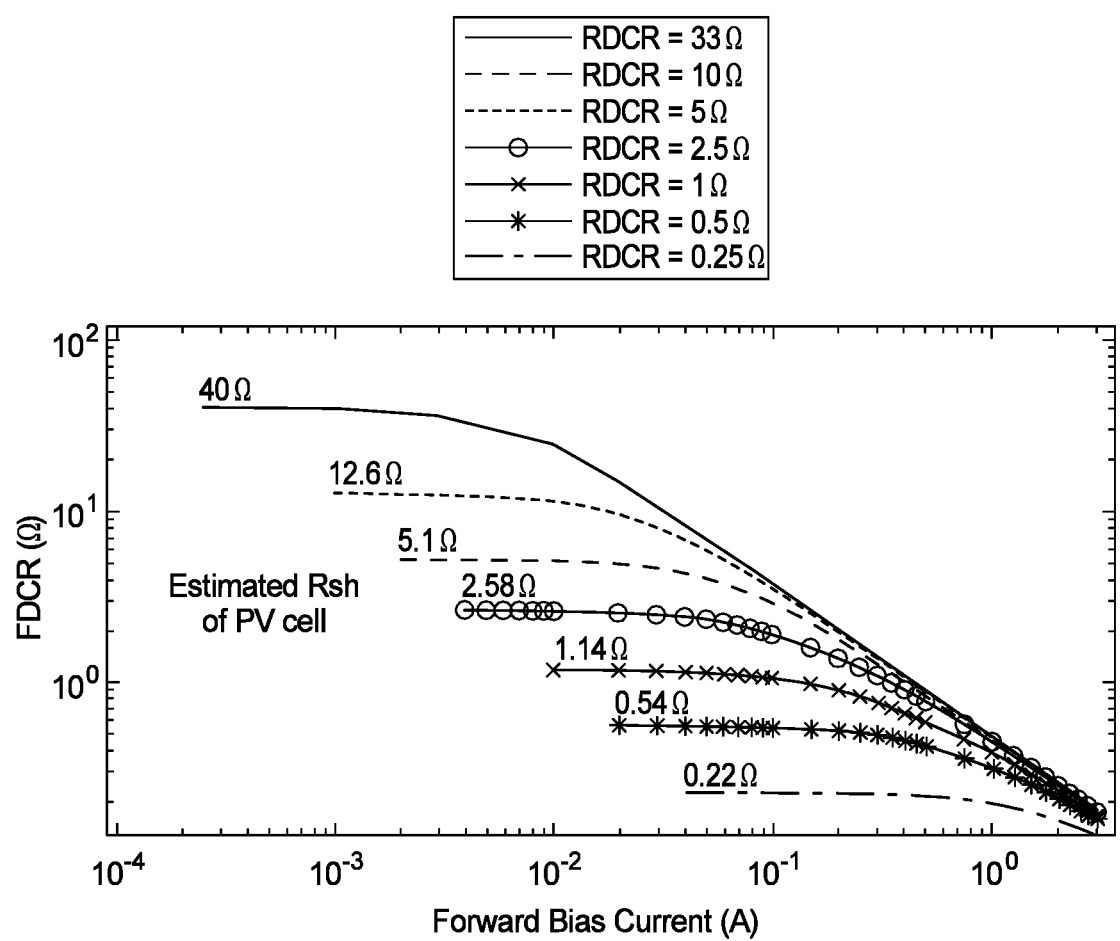
FIG. 12 is a graph illustrating dark FDCR curves at different RDCR values (i.e., PID degradation levels).

The above graphs demonstrate that the FDCR is a good parameter to be used for early PID detection. This is confirmed via the results in FIG. 12, which present dark FDCR. FIG. 12 in particular illustrates dark FDCR curves at different RDCR values (i.e., PID degradation levels). Here, PV cell temperature is again 60° C., while the initial cell power is 3.2 W. Shunt resistance $R_{sh}$ is estimated from the FDCR curves. FIG. 12 illustrates that the FDCR changes steeply with PID progression and especially at low forward bias conditions. FIG. 12 also illustrates that the relative change in the FDCR reduces as the forward bias current increases. The FDCR at high bias current values tends to the same value except at severe PID conditions ($R_{sh}$<0.5Ω). FIG. 12 further illustrates that the FDCR value levels off at low bias currents. From here, the shunt resistance $R_{sh}$ of the PV cell at the various PID stages can be estimated, which is close to the estimated RDCR value.

Figure 13:
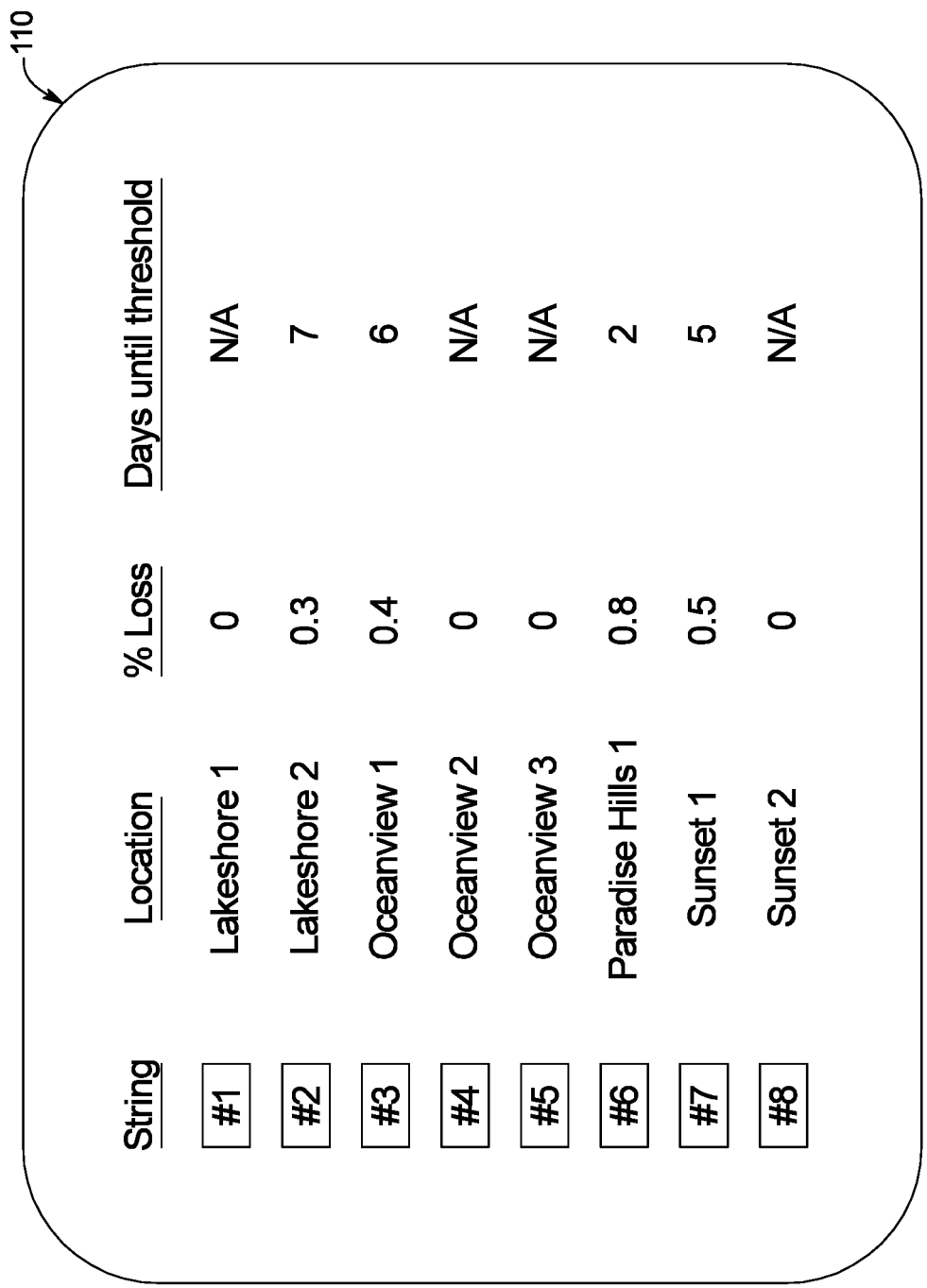
FIG. 13 is a front view of one embodiment of a display screen providing a user interface for navigating the sensor output of the present disclosure.

Referring now to FIG. 13, display screen 110 of personal computer 106 and/or smart device 108 illustrates one possible user interface presented to a user or operator of system 10 of the present disclosure. Display screen 110 is updated by server 100 after each interrogation performed by sensors 50. CPUs 62 of sensors 50 may include or operate with internal timers or be actuated by server 100, e.g., at night when no ambient light is present, so that illumination current IL at equivalent current source 32 is zero or very close to zero. Upon internal timer actuation or remote server 100 actuation, sensors 50 interrogate the negative-most PV module 14n of each PV string 12a to 12n associated with a PV group, such as an area of PV strings 12a to 12n, a facility of PV strings 12a to 12n, a commonly owned group of PC strings 12a to 12n, or some other affiliation of same. Upon completion of the programmed or predefined interrogation of PV modules 14n, each sensor 50 sends its results back to server 100 in a wired or wireless manner described above.

It is contemplated for server 100 to show the latest results from sensors 50. It is also contemplated for server 100 to analyze the latest results from the sensors in light of past data. Doing so allows server 100 to develop trends, e.g., on a PV module 14n by PV module basis 14n and associated PV strings basis. Doing so also allows server 100 to recognize patterns in an artificial intelligence ("AI") type of way, so that server 100 may draw conclusions and make predictions. The output trends stored at server 100 not only allow a user or operator to view past performance, they also allow forward curves to be generated to predict future performance and potential failure times. The patterns may be used for example to define "trouble" areas or times, which heighten the attention given to the associated PV cells or PV modules by server 100 and/or the user or operator. For example, server 100 may recognize certain PV strings 12a to 12n within the group tend to be more predisposed to PID than other PV strings. In another example, server 100 may recognize that PV strings 12a to 12n are more prone to developing PID during certain times of the year or during certain types of weather conditions. In either example, server 100 may be programmed to interrogate the "at risk" strings or conditions rigorously (e.g., test them more often), and/or server 100 may be programmed to alert the user or operator of system 10 to examine the "at risk" strings or conditions more rigorously.

FIG. 13 illustrates one example of a display screen 110 that allows the user or operator to view the most recent results and to dig deeper to view trends and patterns developed at server 100. Display screen illustrates PV strings 1 to 8, which are given location names, such as Lakeshore 1 and 2, Oceanview 1 to 3, Paradise Hill 1 and Sunset 1 and 2. In the illustrated embodiment, the locations may be different streets of a same neighborhood or cluster of residential or commercial buildings. In alternative embodiments, the locations may be different areas or lines of a single facility, or locations at multiple, different facilities, or at any location desiring the use of photovoltaics. PV strings 1 to 8, etc., may or may not be displayed in a same order or juxtaposition as the physical order or juxtaposition of the PV strings at the one or more location. For example, display screen 110 may display a geographical map of the area at which the PV strings are located showing the PV strings located at their mapped locations.

In the example of FIG. 13, each PV string 1 to 8 is shown in connection with a percentage loss of the associated PV module 14n's shunt resistance $R_{sh}$ (or associated power loss) and a predicted number of days until the maintenance threshold is met, e.g., 1.0%. Where the percentage loss of PV module 14n shunt resistance $R_{sh}$ is zero, the predicted number of days to threshold is correspondingly N/A. Where the percentage loss of PV module 14n shunt resistance $R_{sh}$ is low, e.g., 0.3%, the corresponding number of days is higher, e.g., seven. Where the percentage loss of PV module 14n shunt resistance $R_{sh}$ is close to the threshold, e.g., 0.8%, the corresponding number of days to recovery is less, e.g., two days.

In an embodiment, any of PV strings 1 to 8, each illustrated in selectable boxes may be selected to advance to a new display on display screen 110 (e.g., via touch screen, mouse and cursor, etc.), which highlights the selected PV string 1 to 8. Once a PV string 1 to 8 is selected, display screen 110 in one embodiment advances to a new screen that is dedicated to the selected PV string. The dedicated PV screen may illustrate and one or more of (i) a rolling trend showing PV module 14n shunt resistance $R_{sh}$ (or associated power loss) plotted over time, e.g., highlighting when recovery (if any) has been performed, (ii) how many modules are part of the string, (iii) how many cells are part of the modules, (iv) a maintenance log highlighting any notes associated with any maintenance performed, etc. Any of the imbedded displays of display screen 110 may be provided with a "back" button or selectable area to allow the user or operator to navigate back and forth for different modules PV strings 1 to 8.

So display screen 110 allows recovery of a PV string 1 to 8 to be commenced even prior to reaching the threshold shunt resistance $R_{sh}$ loss (or associated power loss), e.g., 1.0%. In an embodiment, the recovery procedure includes applying a positive voltage at the negative end 12– of PV string 12a to 12n at night using a high voltage power supply unit. The same high voltage power supply unit may be used during the day for recovery by disconnecting the effected PV string 12a to 12n from the rest of PV system 10 and biasing its negative end 12– with the positive voltage.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A photovoltaic ("PV") sensor for the early detection of potential induced degradation ("PID") comprising:
a housing;
a power source located within the housing;
an electrical connection presented by the housing for electrically communicating the power source with a PV module, wherein current supplied by the power source to the PV module is less than 10 mA; and
an isolation device configured to electrically isolate the PV module from the remainder of a PV string when the current is supplied by the power source to the PV module, wherein the isolation device includes a switch or a metal-oxide-semiconductor field-effect transistor ("MOSFET").

2. The PV sensor of claim 1, wherein the electrical connection includes leads or contacts, plug-in connectors, or a plurality of electrical lines for connecting to the PV module.

3. The PV sensor of claim 1, which includes an electrical detector located within the housing, and wherein electrical lines in electrical communication with the electrical detector are placed in electrical communication with the PV module so as to measure at least one shunt resistance within the PV module.

4. The PV sensor of claim 3, which includes a central processing unit ("CPU") configured to perform an analysis of an output from the electrical detector, the output indicative of the at least one shunt resistance within the PV module, the CPU determining at least one of PID development or a percentage power loss of the PV module from the analysis.

5. The PV sensor of claim 4, wherein the analysis of the output from the electrical detector by the CPU assumes an illumination current provided by the PV module is zero.

6. The PV sensor of claim 1, which includes a central processing unit ("CPU") configured to cause the isolation device to electrically isolate the PV module from the remainder of the PV string.

7. The PV sensor of claim 6, wherein the CPU is further configured to cause the isolation device to place the PV module back online after the current is supplied by the power source to the PV module.

8. The PV sensor of claim 1, which includes at least one of a cable for wired communication with a central server or a wireless communication device for wireless communication with a central server.

9. The PV sensor of claim 1, which is configured to automatically and at night electrically isolate the PV module from the remainder of the PV string when the current is supplied by the power source to the PV module.

10. A photovoltaic ("PV") sensor for the early detection of potential induced degradation ("PID") comprising:
a housing;
a power source located within the housing;
an electrical connection presented by the housing for electrically communicating the power source with a PV module;
an electrical detector in electrical communication with the electrical connection;
a switch or a metal-oxide-semiconductor field-effect transistor ("MOSFET") configured to electrically isolate the PV module from the remainder of a PV string; and
a central processing unit ("CPU") configured to (i) cause the switch or MOSFET to electrically isolate the PV module from the remainder of a PV string and (ii) analyze an output from the electrical detector and determine, based on the output, a power loss of the PV module relative to a threshold power loss.

11. The PV sensor of claim 10, wherein the threshold power loss is 1.0%.

12. A photovoltaic ("PV") assembly for the early detection of potential induced degradation ("PID") comprising:
a PV string including a plurality of PV modules;
a sensor positioned and arranged to sense a PV module located at the negative voltage end of the PV string, the sensor including
a housing,
a power source located within the housing,
a switch or a metal-oxide-semiconductor field-effect transistor ("MOSFET") configured to electrically isolate the PV module from the remainder of the PV string, and
an electrical connection presented by the housing to electrically communicate the power source with the PV module located at the negative voltage end of the PV string for detecting at least one of PID development in or a percentage power loss of the PV module when the PV module is isolated from the remainder of the PV string by the switch or MOSFET.

13. The PV assembly of claim 12, wherein current supplied by the power source to the PV module located at the negative voltage end of the PV string is less than 10 mA.

14. The PV assembly of claim 12, wherein the PV module located at the negative voltage end of the PV string includes a plurality of PV cells having shunt resistances in series electrical connection with the power source.

15. The PV assembly of claim 12, which includes a central processing unit ("CPU") configured to cause the switch or MOSFET to electrically isolate the PV module from the remainder of the PV string.

16. The PV assembly of claim 12, wherein the PV string is a first PV string and the sensor is a first sensor, which includes a second PV string including a plurality of PV modules, a second sensor positioned and arranged to sense a PV module located at the negative voltage end of the second PV string, and a central server, the first and second sensors configured to wired or wirelessly communicate PV string interrogation results to the central server.

17. A photovoltaic ("PV") system for the early detection of potential induced degradation ("PID") comprising:
a sensor including
a housing,
a power source located within the housing,
a switch or a metal-oxide-semiconductor field-effect transistor ("MOSFET") configured to electrically isolate a PV module from the remainder of a PV string, and
an electrical connection presented by the housing for electrically communicating the power source with a PV module for detecting at least one of PID development in or a percentage power loss of the PV module when the PV module is isolated from the remainder of the PV string by the switch or MOSFET; and
a central server in data communication with the sensor, wherein the central server is configured to enable a display screen to be populated according to data outputted from the sensor.

18. The PV system of claim 17, which includes a plurality of PV sensors in data communication with the central server, wherein the central server is configured to populate at least one display screen according to data outputted from the plurality of sensors.

19. The PV system of claim 17, wherein the central server is configured to produce at least one trend or determine at least pattern using a sensed shunt resistance of the PV module.

20. The PV system of claim 17, wherein the display screen is configured to display at least one of a (i) shunt resistance or PV module power loss indicator or (ii) a time remaining to a shunt resistance or PV module power loss threshold indicator.

21. The PV system of claim 17, wherein the display screen includes a selectable icon representing the PV module, the display screen displaying additional information concerning the PV module when the selectable icon is selected.

* * * * *